United States Patent [19]
Kou et al.

[11] Patent Number: 5,370,078
[45] Date of Patent: Dec. 6, 1994

[54] METHOD AND APPARATUS FOR CRYSTAL GROWTH WITH SHAPE AND SEGREGATION CONTROL

[75] Inventors: Sindo Kou; Ming-Hsien Lin, both of Madison, Wis.

[73] Assignee: Wisconsin Alumni Research Foundation, Madison, Wis.

[21] Appl. No.: 983,776

[22] Filed: Dec. 1, 1992

[51] Int. Cl.$^5$ .............................................. C30B 15/22
[52] U.S. Cl. ..................................... 117/209; 117/208
[58] Field of Search ..................... 156/605, 608, 617.1; 422/246, 249, 254

[56] References Cited

U.S. PATENT DOCUMENTS

| | | | |
|---|---|---|---|
| 3,002,824 | 10/1961 | Francois | 156/603 |
| 3,025,191 | 3/1962 | Leverton | 422/249 |
| 3,265,469 | 8/1966 | Hall | 156/617.1 |
| 3,291,574 | 12/1966 | Pierson | 156/617.1 |
| 3,291,650 | 12/1966 | Dohmen et al. | 156/617.1 |
| 3,471,266 | 10/1969 | Labelle, Jr. | 156/617.1 |
| 3,527,574 | 9/1970 | Labelle, Jr. | 156/617.1 |
| 3,846,082 | 11/1974 | Labelle, Jr. | 156/617.1 |
| 3,915,662 | 10/1975 | Labelle et al. | 156/617.1 |
| 4,167,554 | 9/1979 | Fisher | 422/246 |
| 4,185,076 | 1/1980 | Hatch et al. | 422/246 |
| 4,515,204 | 5/1985 | Ohno | 164/483 |
| 4,894,206 | 1/1990 | Yamashita et al. | 156/617.1 |
| 4,937,053 | 6/1990 | Harvey | 422/246 |
| 4,944,925 | 7/1990 | Yamauchi et al. | 156/617.1 |

OTHER PUBLICATIONS

Marshall Sittig, Semiconductor Crystal Manufacture, Electronics Materials Review No. 3 (book), Noyes Development Corporation, Park Ridge, N.J. 1969, pp. 54–57. (1969).
Crystal Growing, brochure published by Leybold AG, publication date unknown but believed to be 1989.
K. Kitamura, et al., "Stoichiometric LiNbO3 single crystal growth by double crucible Czochralski method using automatic powder supply system," Journal of Crystal Growth, vol. 116, (1992) pp. 327–332.

Primary Examiner—R. Bruce Breneman
Assistant Examiner—Felisa Garrett
Attorney, Agent, or Firm—Foley & Lardner

[57] ABSTRACT

Growth of monocrystalline rods from a bulk melt is carried out by a modified Czochralski process using a float which floats on the bulk melt held in a crucible. Melt flows through a passageway in the float to a crystal growth zone at a rate which prevents diffusion of dopant from the growth zone to the bulk melt. The shape of the crystal may be determined by a shaper wall in the float which defines the growth zone, in which case the crystal body is pulled from the float as it grows without rotating the crystal. The temperature of the float near the shaper wall may be monitored and controlled to control the crystallization process.

27 Claims, 12 Drawing Sheets

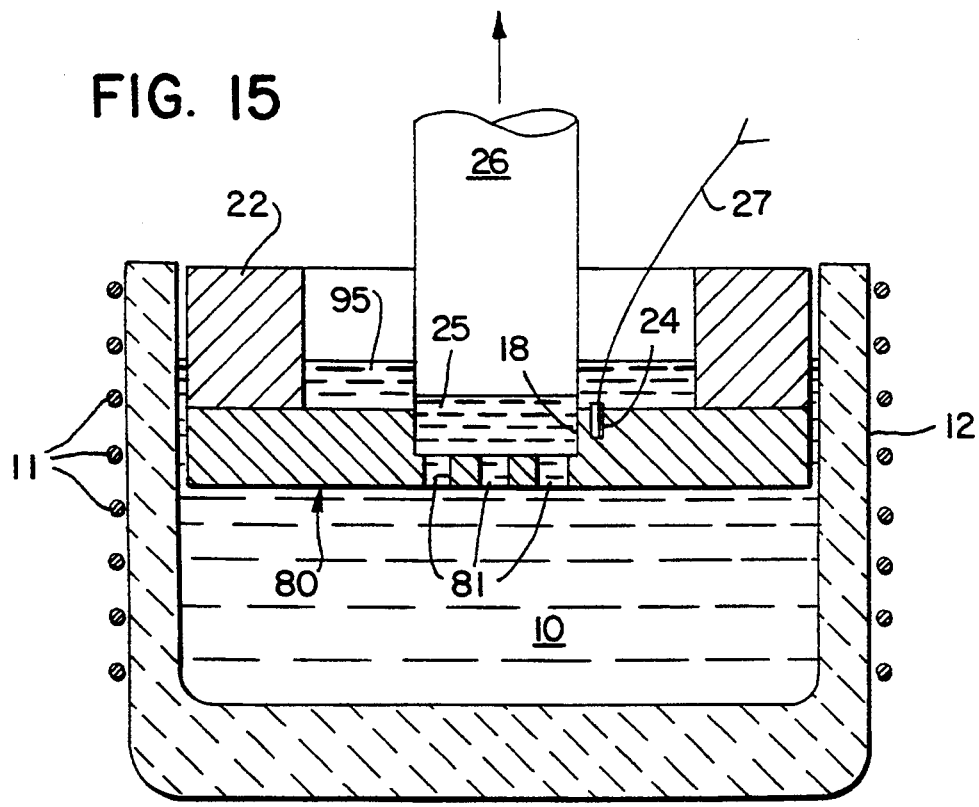

METHOD AND APPARATUS FOR CRYSTAL GROWTH WITH SHAPE AND SEGREGATION CONTROL

This invention was made with United States Government support awarded by the National Science Foundation (NSF), Grant No. CTS 9015217. The United States Government has certain rights in this invention.

FIELD OF THE INVENTION

This invention relates to apparatus and methods employed in the growing of a monocrystalline structure from a melt of polycrystalline material.

BACKGROUND OF THE INVENTION

Monocrystalline material is used in the manufacture of a wide variety of products, such as integrated circuits, optical systems, and various other microminiature devices. There are a number of methods that are utilized in the growth of a monocrystalline structure from a melt. A synopsis of some of the more significant methods is given below.

The Czochralski method involves the melting of a polycrystalline charge in a crucible by radio frequency induction or resistance heating. A monocrystalline seed is then lowered into the melt while being rotated in, e.g., a clockwise direction. The crucible and its charge, if desirable, can be rotated in a counterclockwise direction. The seed crystal is withdrawn at a slow rate from the melt until the desired diameter of the pulled monocrystalline structure is obtained. The pull speed is adjusted to maintain the desired diameter of the pulled structure. This procedure continues as long as there is melt remaining in the crucible. One problem encountered with the Czochralski method is that of controlling the cross-sectional area of the crystal. Although a circular cross-section is produced, the diameter of the crystal has a tendency to vary widely as the growth proceeds. An additional disadvantage is that the monocrystalline structure pulled from the charge may be contaminated by the material of the crucible. Furthermore, a dopant, which is intentionally added to control the properties of the crystal to be grown, may be unevenly and unpredictably distributed through the crystal, causing non-uniformity in physical properties. The concentration of dopant in the bulk melt tends to increase as the crystal grows because dopants and other impurities tend to be rejected by the growth front back to the bulk melt. Examples of dopants are P and B in n and p-type Si semiconductors, respectively, and Nd in YAG (yttrium aluminum garnet) lasers.

The Stepanov method (See A. V. Stepanov, *Bull. Acad. Sci. USSR*, Vol. 33, 1969, p. 1775) is a modification of the conventional Czochralski method. In the Stepanov method, a die member is mounted at a fixed position within the crucible such that the upper edges of the die are above the surface of the melt and the bottom of the die is well below the surface of the melt. The key to Stephanov's technique is shaping a melt column which is used to control the crystal shape. See H. E. LaBelle, Jr., *J. Crystal Growth*, Vol. 50, 1980, p. 8. A difficulty with the Stepanov method is that constant control of the melt level in the crucible is required, because the level of the melt and hence the shape of the melt column will vary upon formation of the crystal.

The Stephanov method has been used for Ge, Si, and InSb, and graphite shapers are usually used. Limitations of this method are that careful adjustments must be made to keep the shaper top even with the melt level at all times. In general, the melt must not wet the shaper.

For growth of thin sheets, thin tubes, ribbons and fibers of sapphire, an edge-defined film fed growth method (EDFG) is disclosed by La Belle, Jr., in, e.g., U.S. Pat. Nos. 3,471,266; 3,527,574; 3,846,082, and 3,915,662. A fixed capillary tube is used as a shaper. No thermocouple is attached to the shaper. It is necessary for the melt to wet the shaper, which causes it to sink if it is in the form of a thin washer. One problem with the method is that cross-sections of the crystals are prohibitively small. The cross-section of the crystal decreases as the melt level drops.

In the edge-defined, film-fed growth (EDFG) technique, the shape of the crystalline body is determined by the external or edge configuration of the end surface of a forming member or die. An advantage of the process is that bodies of selected shapes such as round tubes or flat ribbons can be produced. The process involves growth on a seed from a liquid film of feed material sandwiched between the growing body and the end surface of the die, with the liquid in the film being continuously replenished from a suitable melt reservoir via one or more capillaries in the die member. By appropriately controlling the pulling speed of the growing body and the temperature of the liquid, the film can be made to spread (under the influence of the surface tension at its periphery) across the full expanse of the end surface of the die until it reaches the perimeter or perimeters thereof formed by intersection of that surface with the side surface or surfaces of the die. The angle of intersection of the aforesaid surfaces of the die relative to the contact angle of the liquid film is such that the liquid's surface tension will prevent it from overrunning the edge or edges of the die's end surface. The growing body grows to the shape of the film which conforms to the edge configuration of the die's end surface.

The Bridgman-Stockbarger method utilizes an elongated container of material which is melted in a high temperature furnace, after which the container is lowered into a cooler, lower temperature furnace, which allows the material to slowly resolidify as a single crystal. The molten material is in contact with the container wall during the process, and as a result, strains occur in the material which induce defects when the molten material solidifies.

Float zone refining is another method used to convert polycrystalline material to a high quality monocrystalline rod and, simultaneously, to remove unwanted impurities from the material. In the float zone technique a narrow molten zone is caused to move slowly along the length of a vertically disposed rod of polycrystalline material. As the molten zone moves, the material immediately behind the zone resolidifies as monocrystalline material. The monocrystalline growth is initially nucleated by a single crystal seed and then continues in a self-seeding manner. Impurities in the material tend to congregate in front of the molten zone so that as the molten zones moves, the zone also removes impurities with it, leaving the material behind the zone in a purer state.

In the float zone process with a contactless heater, the molten zone is caused to transverse the length of the polycrystalline rod by moving the rod vertically downward past a stationary heating means such as a radio frequency induction coil that surrounds a material in the contactless manner. In an alternate embodiment of the float zone refining process with a contactless heater, the rod is stationary and the heater moves vertically across the length of the rod. In addition to the translational motion, a rotational motion may also be imparted to improve crystal perfection and uniformity. The float zone process with a contactless heater, while producing a clean monocrystalline result, is very unstable in that the melt zone tends to collapse.

Variation of crystal diameters is a significant problem in crystals made by the conventional Czochralski method. Sophisticated control systems have been proposed, but are limited in that only round crystals can be grown.

The Czochralski method has been modified by use of shapers in the crystal producing apparatus, to overcome some of the problems identified in the basic, or conventional Czochralski method.

Floating-shaper methods have used to grow Ge and Si crystals using a floating cover or crucible of graphite. See, e.g., U.S. Pat. Nos. 3,002,824; 3,291,574; and 4,167,554. Typically the shaper temperature is not controlled. To keep a crystal diameter uniform, a laser beam may be shone on the meniscus to detect variations in the diameter of the crystal. If the crystal diameter increases, the melt temperature or pulling speed is increased to reduce crystal diameter. (See U.S. Pat. No. 3,291,650.) Limitations include complications due to lowering of the melt level. It does not work well if the melt is encapsulated or transparent.

The Ohno continuous casting method (OCC) has been used for a number of metals and alloys. See, e.g., U.S. Pat. No. 4,515,204. In the Ohno method, the mold is heated with an internal heater to slightly above the melting point of the crystal material. Horizontal and downward casting were used for smaller cross-sections, in which melt break out can be avoided. Limitations are the need for careful adjustments to keep the top of the shaper even with the melt levels at all times. The melt must not wet the mold.

Shaped crystal growth technology is an active area in growth of crystals for use in electronic, optical, and structural materials. See, e.g., *Proceedings of Shaped Crystal Growth*, 1980, 1987, 1989, North Holland Press.

Most dopants in single crystals have an equilibrium segregation ratio (k) not equal to unity and thus have a natural tendency to segregate along the crystals. Dopant segregation can be aggravated by convection in the melt during crystal growth, which in the case of Czochralski pulling is induced mainly by gravity and crystal rotation.

Several techniques have been used to try to control dopant segregation in Czochralski pulling. In the push-pull technique, feeding must be kept at the same rate as pulling, which is complicated by the fact that the crystal diameter tends to vary during pulling. Also, to accommodate both the feed rod and the growing crystal in a single crucible, the crucible diameter is nearly doubled, thus promoting gravity-induced natural convection in the melt. A two-crucible version of the push-pull technique has been used, one crucible for feeding and the other for pulling. In a similar technique, i.e., the drop-pull technique, an immersed partition cylinder is used to separate the crucible into two regions, the inner one for pulling and the outer one for dropping the feed powder. In the floating-crucible technique, the bottom of the floating crucible is connected to a weight under the outer crucible, with a connecting shaft which goes through the bottom of the main crucible and melt in it.

It is worth noting that electromagnetic fields, which can only be applied to current-conducting melts, can help reduce dopant segregation by reducing convection in the melt. However, as long as $k \neq 1$, dopant segregation will occur even in a completely convectionless state. This situation is particularly bad if k is far from unity.

The present invention addresses the problems in producing crystals of uniform diameter and dopant distribution.

SUMMARY OF THE INVENTION

The methods and apparatus of the present invention employ shaped crystal growth technology and enable the production of crystals by a modified Czochralski method which have uniform diameters and a variety of shapes as defined by the cross-section of the crystal. The ability to provide a variety of cross-sectional shapes has important commercial advantages. Machine costs are reduced because crystals of different diameters may be produced from the same basic apparatus. Other advantages of the invention include reduced waste of crystal materials due to more complete drainage of the container for the melt from which crystals are drawn, and predictable sizes and shapes, thereby allowing more precise calculation of materials and obviating the need to trim crystals. Another advantage is the close control of dopant distribution within the crystal formed.

The present invention provides improved control over the Czochralski growth of a monocrystalline structure from a melt of polycrystalline material using zone leveling and control of the temperature of the melt at the growing and shaping area at which crystal growth occurs. This improved local control results in the production of crystals (ingots), having uniform diameters. Use of the term "crystal" herein also is meant to include the term "ingot". Production of crystals having a variety of different cross-sectional shapes, and more uniform dopant distribution in the formed crystals, are other aspects of the invention.

A general description of the present invention is as follows: a crystal (ingot) is pulled from an opening (also referred to herein as an orifice) of a float floating on a bulk melt contained in a heated container (crucible), the opening being maintained at a temperature sufficiently above the solidifying temperature of the melt to enable control over the cross-section of the crystal. The crucible and the float are constructed of materials that will not react with, or dissolve in, the melt. The temperature of the float may be monitored and the heat applied to the crucible controlled to maintain the float at the desired temperature. The float may be less dense than and supported by floating on the bulk melt, rather than being supported by the surface tension of the melt. Thus, the position of the float with respect to the melt surface remains the same even as the melt level in the crucible is lowered. The melt near the growth front of the crystal is separated from the bulk melt by the float which may act both as a shaper and also as a baffle for melt flowing from the bulk melt to the melt at the orifice, these two portions of the melt preferably being connected by a narrow channel (passageway) or channels in the baffle. The extended passage of the melt through the passageway in the float effectively reduces dopant (solute) segregation along the crystal by reducing dopant exchanges between the two portions of the melt, the growth melt and the bulk melt, and by helping the melt near the growth front quickly reach a steady dopant concentration level. If desired, an appropriate amount of dopant can be added to the melt in the orifice of the float before pulling begins to help reach the steady state concentration even more quickly. Use of the term "dopant" is meant to include "solute" herein. The cross-sectional shape and sizes of the crystals formed conform to the shape and size of the shaper orifice through which they are pulled.

Keeping the growth front flat by use of a shaper in accordance with the invention reduces facet formation, thereby reducing dopant segregation that would otherwise occur due to facet formation.

The orifice in the float is defined by a shaper wall having a shaper edge, and is designed to allow crystals of various cross-sectional shapes to be pulled, e.g., rounds, rectangles, tubes, and the like. The diameter of the melt passageway is preferably selected as small as possible and the passageway is preferably chosen to have as great a length as possible to minimize and preferably prevent diffusion of the dopant from the melt zone back into the bulk melt. The float can contain multiple shaper orifices to allow several crystals to be pulled simultaneously. Growth is continued until the supply of melt is exhausted or until the crystal has reached a desired length.

If desired and appropriate, a liquid encapsulant (e.g., $B_2O_3$) may be put over the float to help prevent evaporation of volatile components from the melt (e.g., As in GaAs, and P in GaP and InP).

In the present invention a wetted shaper may be utilized with appropriate measures to maintain the buoyancy of the shaper, e.g., flotation structure enclosing a volume sufficient to support the float on the melt.

In the present invention, separation of the growth front of the crystal from the bulk melt reduces dopant segregation caused by convection in the melt. A long passageway allows dopant segregation to be maintained. The passageway in the present invention may be made sufficiently long by having a horizontal passageway portion with at least one turn in it. Because the present invention does not require crystal rotation, where rotation is not used rotational dopant striations characteristic of conventional Czochralski pulling are prevented.

Examples of the various types of crystals that can be produced by the present invention include: rectangular YAG laser crystals, which are preferable to the traditional round laser crystals because the rectangular shapes facilitate cooling; Si sheets, which are widely used in solar energy systems; sapphire tubes used as lamp envelopes for laser pumping; sapphire fibers for composite materials; $LiNbO_3$ ribbon crystals for nonlinear optical applications; and single crystal plates of metals as sputtering targets.

Further objects, features and advantages of the invention will become apparent from the following detailed description when taken in conjunction with the accompanying drawings.

BRIEF DESCRIPTION OF THE DRAWINGS

FIG. 15 is a schematic cross-sectional view of apparatus for modified Czochralski crystal growth similar to that of FIG. 12 but with an encapsulant on top of the float to prevent evaporation from the bulk melt.

FIG. 16 is a schematic cross-sectional view of apparatus similar to FIG. 7 but with a straight melt channel.

DETAILED DESCRIPTION OF THE INVENTION

Figure 1:
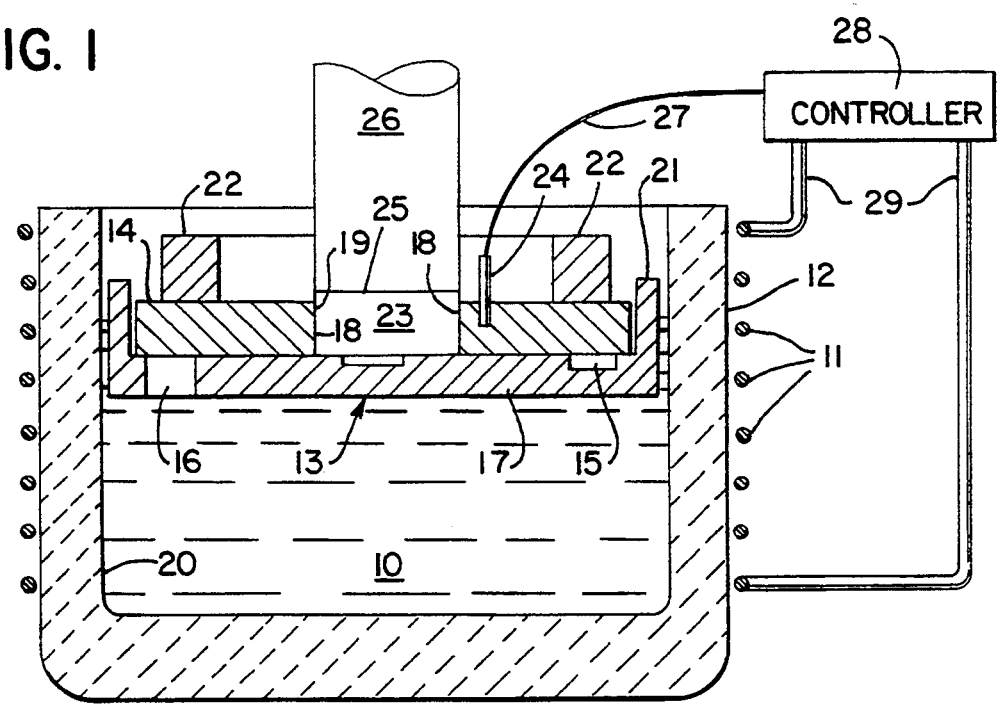
FIG. 1 is a schematic cross-sectional view of apparatus in accordance with the invention for modified Czochralski crystal growth from a melt, the apparatus including a float not wetted by the melt.

The crystal growth apparatus of the present invention provides crystal growth without requiring crystal rotation and, consequently, can reduce rotation-induced dopant striations. Zone leveling is achieved in the apparatus by a float which combines the functions of a shaper and a baffle, with the flow rate of melt into and through the float preferably exceeding the diffusion rate of dopant to prevent back diffusion of the dopant into the bulk melt. A temperature sensor, e.g., a thermocouple, may be attached to the float to help control the cross-section of the crystal, which is an important factor in improving crystal formation, by controlling the temperature of the melt flowing into the float from the bulk melt by control of the crucible temperature. The preferred float of the present invention allow a relatively uniform temperature to be maintained around the float. More uniform and reproducible crystal diameters are produced by the methods of the present invention.

Multiple temperature sensors, for example, multiple thermocouples, can be distributed in the float—in particular if relatively large cross-sections of crystals are desired—to monitor the temperature of the float at various locations.

A float of the invention is formed of materials compatible with the melt material; these materials may be, for example, graphite for use with Si, Ge, InSb, Al and Sn; boron nitride for use with GaAs; and $Al_2O_3$ for use with superalloys. The float may be wetted by the melt, e.g., platinum by oxides and halides, or non-wetted, as appropriate.

The invention may now be exemplified by reference to the embodiments shown in the drawings.

In the apparatus of the invention shown in FIG. 1, the bulk melt 10 is enclosed in a crucible 12 having electrical resistance heater wires 11. The wires 11 allow controlled heat to be applied to the melt within the crucible. As used herein the term heater will be understood to include such heater wires as well as any other heater for applying heat to the melt, such as RF heating, direct flame heating, etc. An exemplary diameter for the crucible is about 4 inches. A float 13 having an upper shaper head 14 and a bottom wall boat plate 17 is laid on the surface of the melt 10. A groove 15 (e.g., about 3/16 inch wide and ⅛ inch high) is formed in the bottom wall 17 and extends horizontally from an opening 16 in the plate to form, with the adjoining shaper head 14, a long, narrow channel or passageway through which melt flows from the bulk melt into a growth zone bounded by shaper walls 18 enclosing a space from which a crystal is pulled. For example, the opening or orifice defined by the wall 18 may be circular and have a diameter in the range of one inch, although smaller and larger openings may be utilized. The melt enters the passageway through the opening 16 in the plate. The top edge 19 of the wall 18 defines the shape of a crystal rod 26 being pulled because the melt in the melt zone 23 solidifies to the single crystal form a short distance above the top or shaper edge 19 of the walls 18. Because the material of the float is not wetted by the melt, the liquid melt in the zone 23 does not flow out onto the top surface of the float beyond the edge 19.

The periphery of the bottom wall boat plate 17 extends near the heated inner wall 20 of the crucible 12 enclosing the melt, but is preferably not in contact with the inner wall; thus, the float is free-floating and capable of movement as a function of the level of the melt in the crucible. Weights 22 may be positioned on the top surface of the shaper head 14 to exert pressure indirectly on the melt so that the melt is forced through the opening 16 and through the passageway 15 into the growth zone 23 and to the crystal front 25 (the liquid/solid interface) at which the crystal rod 26 is formed. In this embodiment, the float is not wetted by the melt so that the pressure applied to the melt helps drive it through the passageway 15. The apparatus of FIGS. 1–3 allows maintenance of a uniform dopant distribution within the crystal, and production of a crystal rod having a uniform crystal diameter. The rod 26 is pulled upwardly without rotation at a controlled speed by a conventional rod pulling mechanism (not shown).

A thermocouple 24 is positioned in the shaper head 14 at a position near the shaper wall 18 to allow the temperature of the float and the melt in the growth zone 23 to be monitored. The thermocouple 24 provides a signal indicative of the temperature of the float on wires 27 to an electrical controller 28 (which may be of any conventional design) which controls the electrical power supplied on power supply lines 29 to the heating wires 11. The controller 28 supplies power to the heating wires 11 as necessary to raise the temperature of the bulk melt when the thermocouple 24 senses that the temperature of the float adjacent the wall 18, and thus the temperature of the melt zone, has dropped below a desired temperature.

Figure 2:
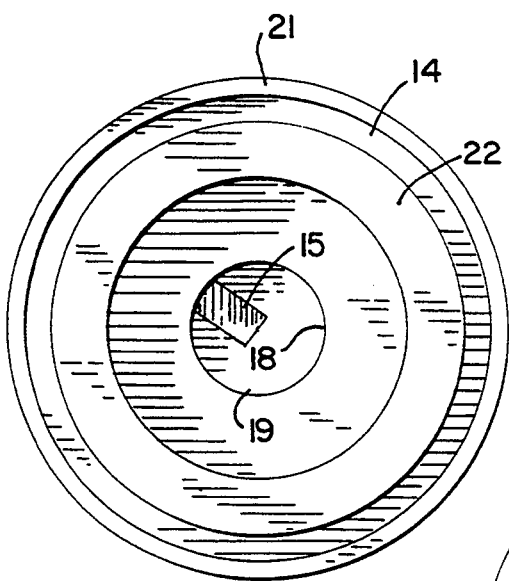
FIG. 2 is a top plan view of the float of FIG. 1.
Figure 3:
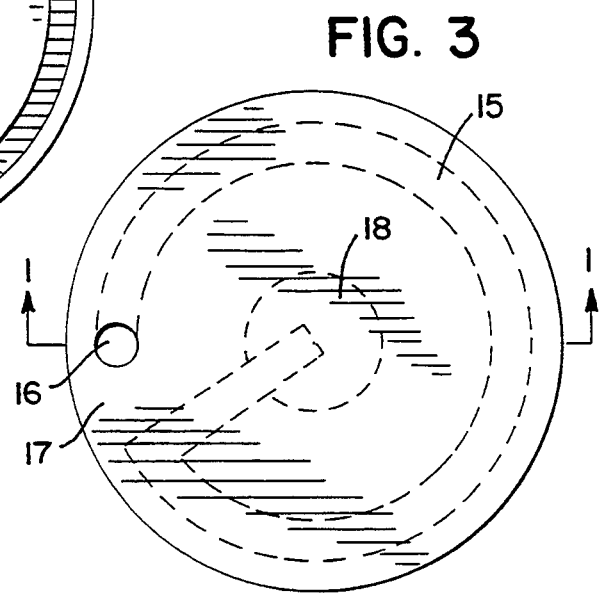
FIG. 3 is a bottom view of the float of FIG. 1.

FIG. 2 is a plan view of the float 13 showing the circular shaper wall 18. FIG. 3 is a bottom view of the float 13 showing the groove 15 (in dashed lines) and the orifice 16. The passageway has a turn in it, in this case a continuous curve, to allow the length of the passageway to be greater than the width of the bottom wall 17. The total length of the passageway 15 defined by the groove is preferably fairly long and narrow, e.g., about 11 inches for a 4 inch diameter shaper, to ensure that the flow through the passageway prevents back diffusion of dopant from the melt zone 23 to the bulk melt 10. In general, the length of the passageway in a non-wetted float of this type can be made even longer, if desired, by making it in a spiral shape. The passageway is sufficiently wide to allow fairly free flow of melt but sufficiently long so that dopants cannot substantially diffuse back from the growth zone to the bulk melt.

Figure 4:
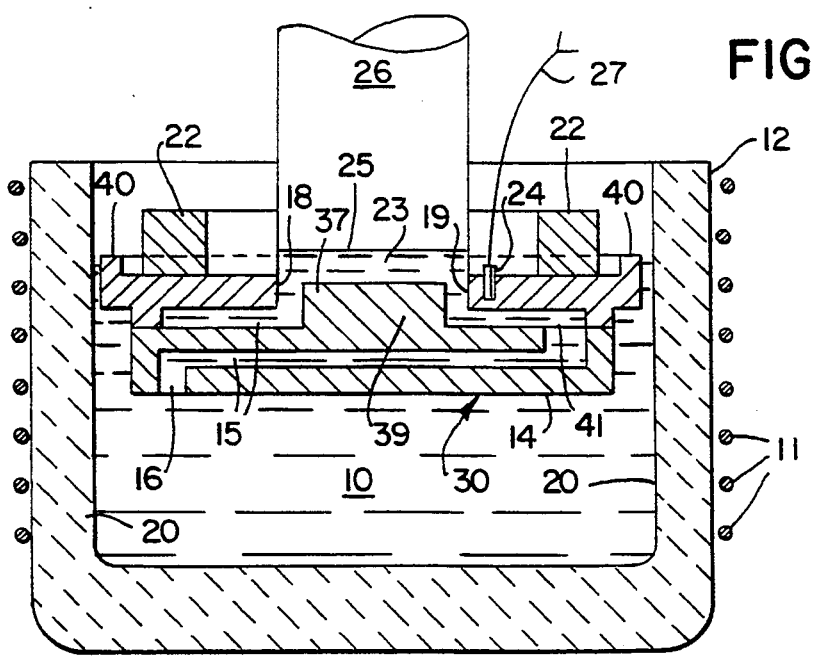
FIG. 4 is a cross-sectional view of a modified embodiment of the apparatus of FIGS. 1-3.
Figure 6:
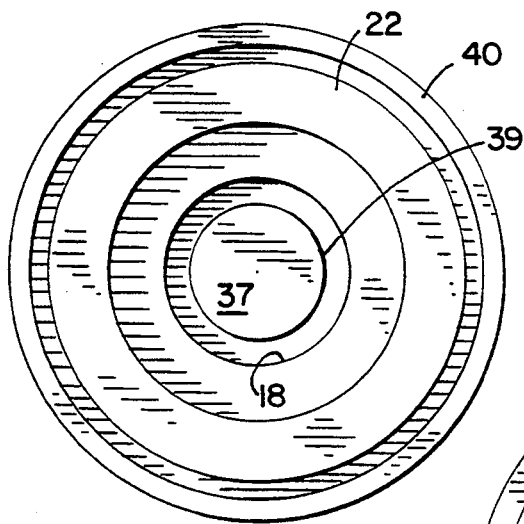
FIG. 6 is a bottom view of the float of the apparatus of FIG. 4.
Figure 5:
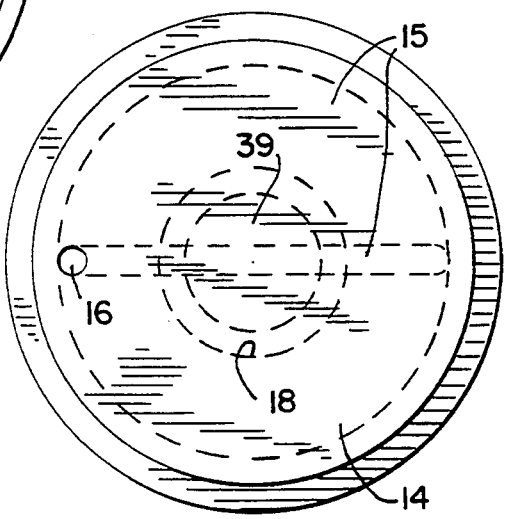
FIG. 5 is a top view of the float of the apparatus of FIG. 4.

FIGS. 4–6 show apparatus having a float 30 similar to that of FIGS. 1–3 but having a pedestal structure 37 in the center of the float with an orifice 39 defined by the shaper wall 18. The float of FIGS. 4–6 is also for a melt which does not wet the shaper material. The spacing between the outer wall of the pedestal 37 and the inner wall 18 defining the orifice is chosen so that melt can flow between these walls. The top surface of the pedestal 37 is preferably chosen to be slightly lower than the surrounding top surface of the float outside the wall 18 and the shaping edge 19 so that the melt flows over the pedestal top surface. A ridge or lip 40 is formed about the top periphery of the float to inhibit flow of the melt from the bulk melt up and onto the top surface of the float 30. The passageway 15 preferably includes a narrow channel in communication with the opening 16 which leads to a position at which it turns up to join a wide space 41 which completely surrounds the pedestal 37 and allows free flow of melt up between the pedestal and the shaper wall 18.

Figure 7:
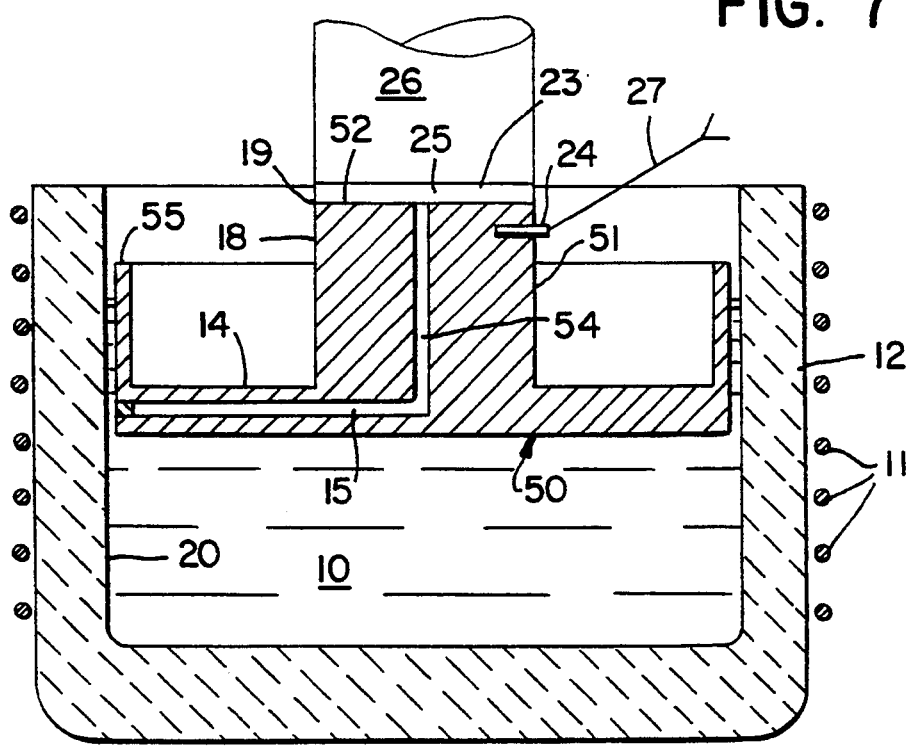
FIG. 7 is a schematic cross-sectional view of apparatus for modified Czochralski crystal growth from a melt which includes a float which is wetted by the melt.
Figure 8:
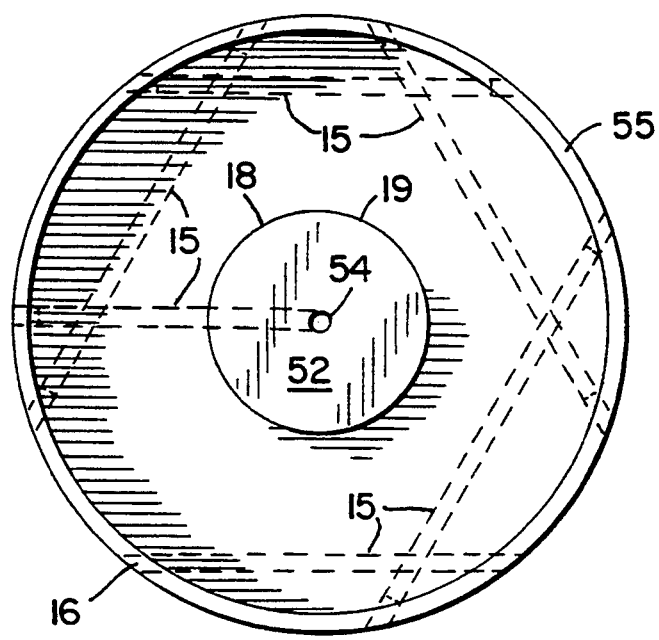
FIG. 8 is a top view of the shaper of the apparatus of FIG. 7.

The float 50 of FIGS. 7 and 8 is formed of a material which is wetted by the melt. In this float, the central pedestal 51 extends to a top surface 52 which is above the level of the melt and also above the surfaces of the float which surround the pedestal 51. The shaper wall 18 is the external wall of the pedestal 51, and the shaper edge 19 is defined by the intersection of the shaper wall 18 with the top surface 52. Melt flows from the bulk melt 10 by capillary action through horizontal passageways 15 and a vertical passageway 54 in the shaper which opens on the top surface 52. The peripheral wall 55 is of a sufficient height to allow the float to sink into the melt 10 until the displacement of melt is sufficient to support the float. The peripheral wall 55 thus provides a flotation structure enclosing a volume sufficient to support the float on the melt. The top surface 52 of the pedestal is completely wetted by the melt, which flows to the edge 19 but not further, because the melt in the melt zone 23 is held to the closely adjacent crystal 26 by surface tension. As illustrated in FIG. 8, the horizontal passageway 15 in the bottom wall has several turns and can be formed of several intersecting channels which are drilled into the plate, with all drill openings except the opening 16 then being closed. This arrangement allows a relatively long passageway 15 to be formed in a relatively flat and thin bottom wall of the float. The thermocouple 24 is embedded in the pedestal 51 preferably Just below the edge 19 to monitor the temperature of the float 50 near its top surface. The temperature of the melt 10 may thus be controlled as described above.

Figure 9:
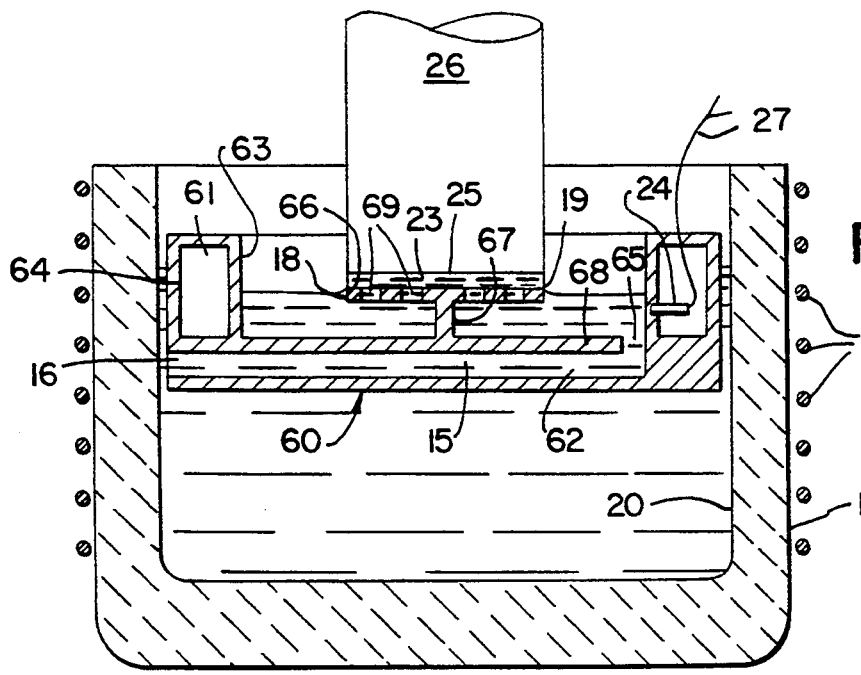
FIG. 9 is a schematic cross-sectional view of another apparatus for modified Czochralski crystal growth from a melt which includes a float which is wetted by the melt.
Figure 10:
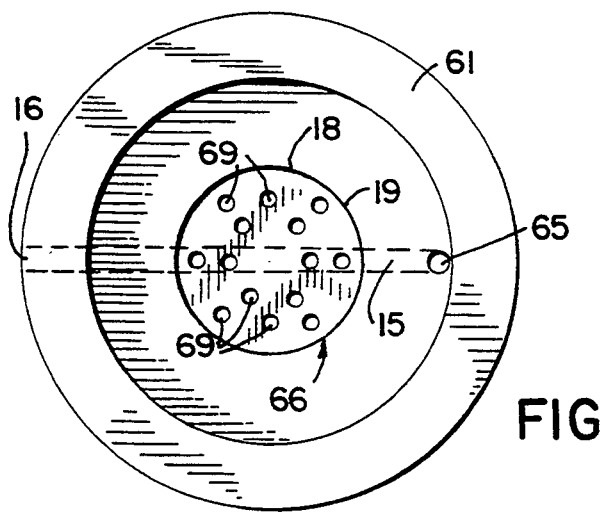
FIG. 10 is a top view of the float of FIG. 9.

FIGS. 9-10 illustrate another embodiment of the apparatus of the invention in which the float 60 is wetted by the melt. In this embodiment, the float has a hollow cylindrical float collar 61 and a bottom plate 62 in which the passageway 15 is formed. The float collar 61 has an inner lateral wall 63 and an outer lateral wall 64 near the inner wall 20 of the crucible 12, but not in contact with it. The walls of the float collar 61 provide flotation structure which enclose a volume sufficient to support the float 60 on the melt. A thermocouple 24 is preferably positioned in the inner lateral wall 63 of the float to monitor the temperature of the wall and, thus, the melt contained with the inner wall of the float. Melt flows through the horizontal passageway 15 and out an opening 65 to partially fill the volume within the inner wall 63 of the float.

The float 60 of FIG. 9 has a pedestal 66 which is supported by a stem 67 which extends from a flat base section 68. The flat, plate-like pedestal 66 has a plurality of apertures 69 formed therein. The top surface of the pedestal is flat and wettable by the melt. The apertures 69 in the pedestal 66 permit melt to flow from the area bounded by the inner lateral wall 63 of the float through the pedestal into the growth zone 23 from which the crystal rod 26 is pulled. Advantages of the float 60 of this embodiment include maintenance of a flat growth front and a uniform dopant distribution in the crystal 26, and a uniform crystal diameter. The many holes 69 in the pedestal 66 (which is bounded by the shaper edge 19 and the outwardly facing shaper wall 18) help the melt near the crystal front 25 and the melt in the growth zone 23 stay very close to each other in composition because of free flow of melt through the pedestal from the reservoir of melt within the wall 63. The relatively long, narrow passageways 15 help ensure that the flow rate of melt through the passageways is greater than the back diffusion of dopant from the melt volume within the wall 63 to the main melt 10 within the crucible. FIG. 10 is a top view of the float showing the hole 65 and the pedestal 69.

If the concentration of dopant in the bulk melt 10 is $C_o$, and the desired concentration in the pulled crystal 26 is $C_o$, the concentration of the dopant in the melt 23 in the growth zone 23 will be $C_o/k$, where k is the segregation ratio of the dopant. In conventional Czochralski processes, dopant segregation can be aggravated by convection of the bulk melt and by crystal rotation. The embodiments of FIGS. 1-10 provide not only a shaping of the crystal, but also a baffle effect to isolate the growth front from the bulk melt. By this means, the dopant rejected by the growth front is not swept continuously into the bulk melt, but quickly reaches a steady, saturated concentration level within the small volume growth zone 23. Thus, axial segregation of the dopant in the crystal 26 is minimized. In prior art processes, dopant concentration tends to be uneven and unpredictably distributed within the crystal, causing structural defects and unpredictability of various characteristics of the crystal.

Figure 12:
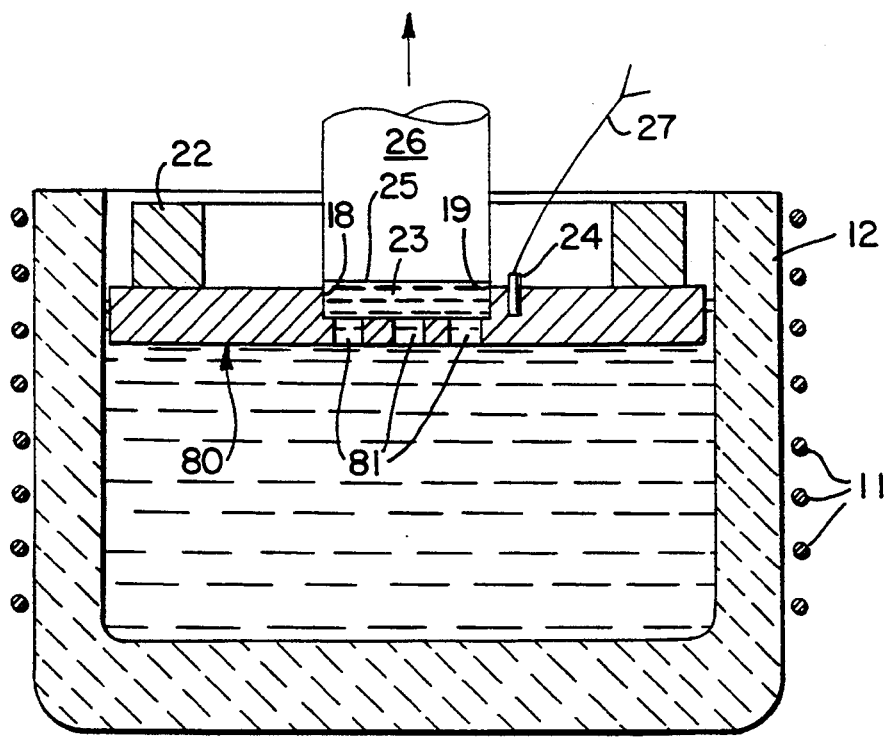
FIG. 12 is a cross-sectional view of apparatus similar to that shown in FIG. 11, but with multiple passageways between the melt zone and the crystal growth zone.
Figure 11:
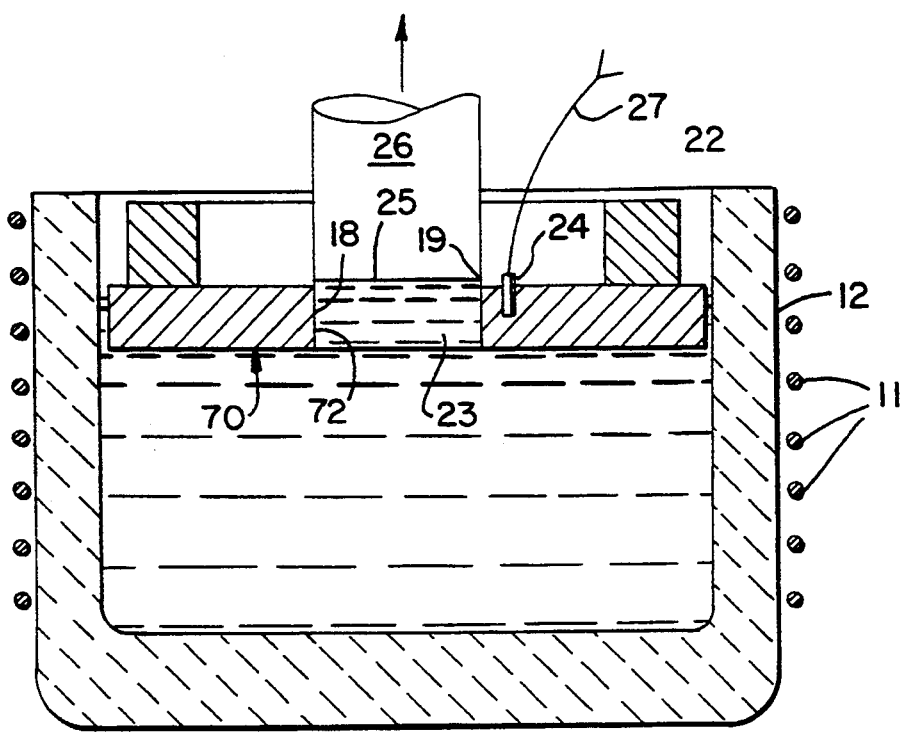
FIG. 11 is a schematic cross-sectional view of a further apparatus for modified Czochralski crystal growth which includes a float with a single broad passageway from the bulk melt to the crystal growth zone.

The float 70 of FIG. 11 is similar to the float 13 of FIG. 1 except that the bulk melt 10 and the melt in the zone 23 which is pulled into the crystal 26 are in communication through a wide passageway 72 which allows free flow of melt from the bulk melt 10 into the growth zone. Although the shaper 70 of FIG. 11 does not have the advantage of maintaining the same dopant concentration in the growth zone as in the bulk melt, the temperature of the float is monitored and controlled by use of the thermocouple 24 near the shaper wall 18, which allows formation of a more uniform crystal than is obtained in prior art processes. FIG. 12 illustrates a float 80 similar to the float of FIG. 11 wherein plural passageways 81 are formed in the float leading directly from the bulk melt to the growth zone to provide a more controlled flow with less convection.

The thermocouple 24 (or other temperature sensor or monitoring device) is used to control the float temperature, which in accord with the present invention has been found to be an important factor in achieving desirable crystal growth. If a float temperature just below the melting point of the crystal material is maintained, the melt in the melt zone will adhere to and move up (pull up) the float. In some materials, if the float temperature is more than about 5° C. above the melting point, the material in the melt zone can neck in significantly. Thus, it is desirable to maintain the float temperature within a range from at or just below the melting point to a few degrees above the melting point. As described above, such control can be achieved in the present invention.

Figure 13:
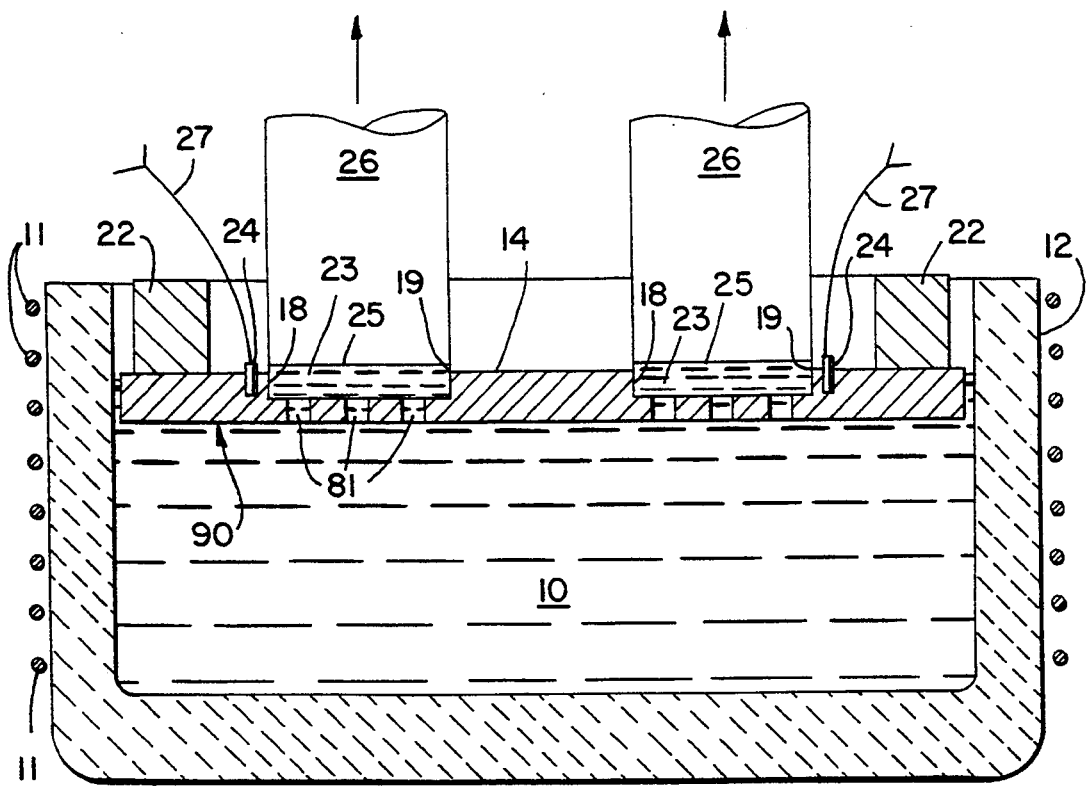
FIG. 13 is a schematic cross-sectional view of a device similar to that of FIG. 12 but having multiple zones of crystal growth which permits simultaneous pulling of several crystals.
Figure 14:
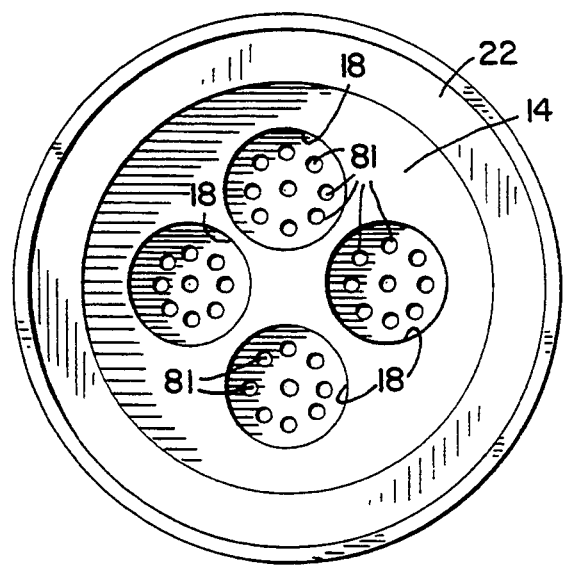
FIG. 14 is a top view of the float of the apparatus of FIG. 13.

If desired, several crystal rods may be pulled simultaneously using the apparatus of the invention. Thus, the rate of production can be increased while using only a single float. FIGS. 13 and 14 show embodiments of the apparatus in which the float 90 has multiple shaper walls 18 but is otherwise similar to the float 80. A thermocouple 24 is preferably located adjacent each shaper wall 18 to allow the temperature of the float near each wall to be monitored and controlled by controlling the heat applied to the bulk melt.

FIG. 15 shows an apparatus similar to that of FIG. 12, with the addition of a liquid encapsulant 95 which covers the float 80 to prevent evaporation of certain types of melts, e.g., melts containing As, P and Hg. The most well known encapsulant for crystal growth is $B_2O_3$. The methods and apparatus of the present invention are thus suitable for use in liquid encapsulated Czochralski as well as in conventional Czochralski processes, e.g., for growth of such materials as GaAs, GaP, InP and the like.

The float 100 of FIG. 16 is similar to the float 50 of FIG. 7 except that the melt channel 101 extends straight down from the top surface 52 of the float to a bottom outlet 102. If the pedestal 51 is high enough, the channel 101 will be sufficiently long to provide adequate control over dopant segregation. This float is wetted by the melt and the wall 55 provides the flotation structure which encloses a volume sufficient to support the float on the melt.

Figure 18:
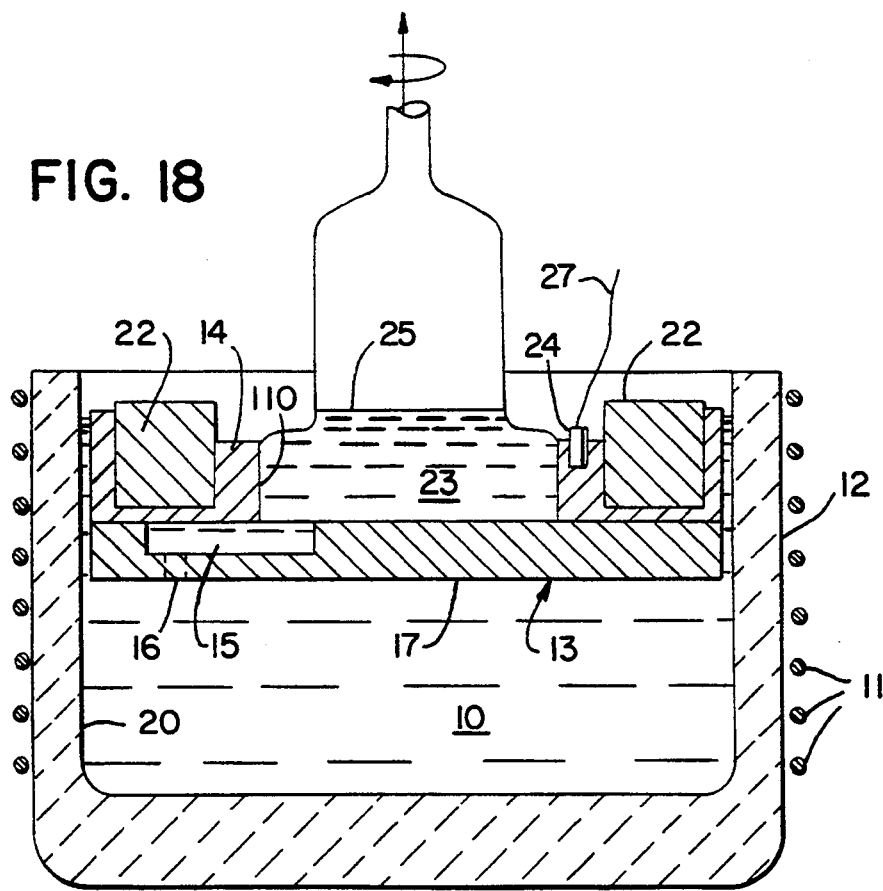
FIG. 18 is a schematic cross-sectional view of apparatus in accordance with the invention which provides dopant segregation but not shaping.
Figure 19:
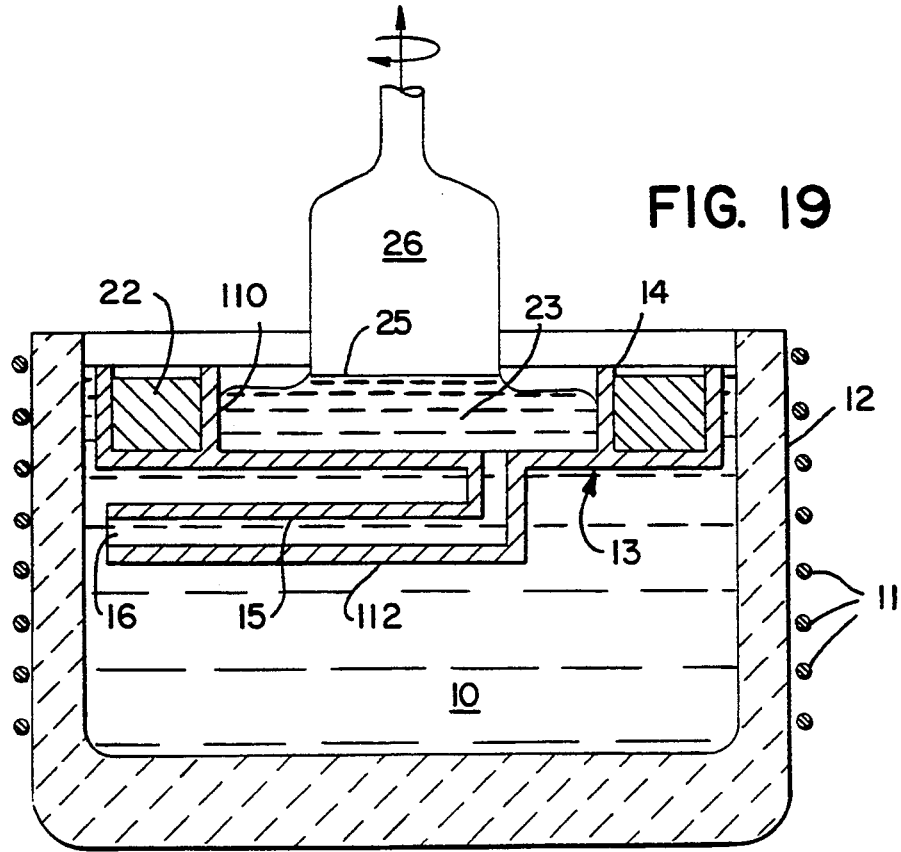
FIG. 19 is a schematic cross-sectional view of another apparatus which provides dopant segregation but not shaping.

FIGS. 18 and 19 show apparatus in accordance with the invention which provide control over dopant segregation but do not shape the crystal. The float 13 of FIG. 18 may have essentially the same structure as that of FIG. 1 with the difference that the cylindrical inner wall 110 of the float has a larger diameter than the diameter of the crystal 26, so that the wall 110 does not shape the crystal. Further, the crystal is rotated as it is grown, in accordance with conventional Czochralski practice. In fact, the apparatus of FIG. 1 (as well as embodiments shown other figures) may be used with conventional Czochralski rotation and without shaping by rotating the crystal and pulling it at rates sufficient so that the formed crystal is narrower in diameter than the shaper wall. Nonetheless, crystals grown with such apparatus have the benefit of the dopant segregation provided by the floats having melt passageways long enough and narrow enough to maintain segregation, or the benefit of the temperature control of the melt at the melt/crystal interface, or both.

FIG. 19 shows a variation of the float of FIG. 18 in which the melt conduit is formed as a relatively long tube 112 which extends downwardly and then horizontally to provide a relatively long melt passageway. Such a structure may be formed of materials as quartz.

Where a float such as that shown in FIGS. 7, 9 or 16 is used, the top surface 52 may be inclined (or otherwise shaped) rather than horizontal, to control the shape of the growth front. For example, an inclined top surface will tend to drive dislocations out of the growing crystal.

Figure 21:
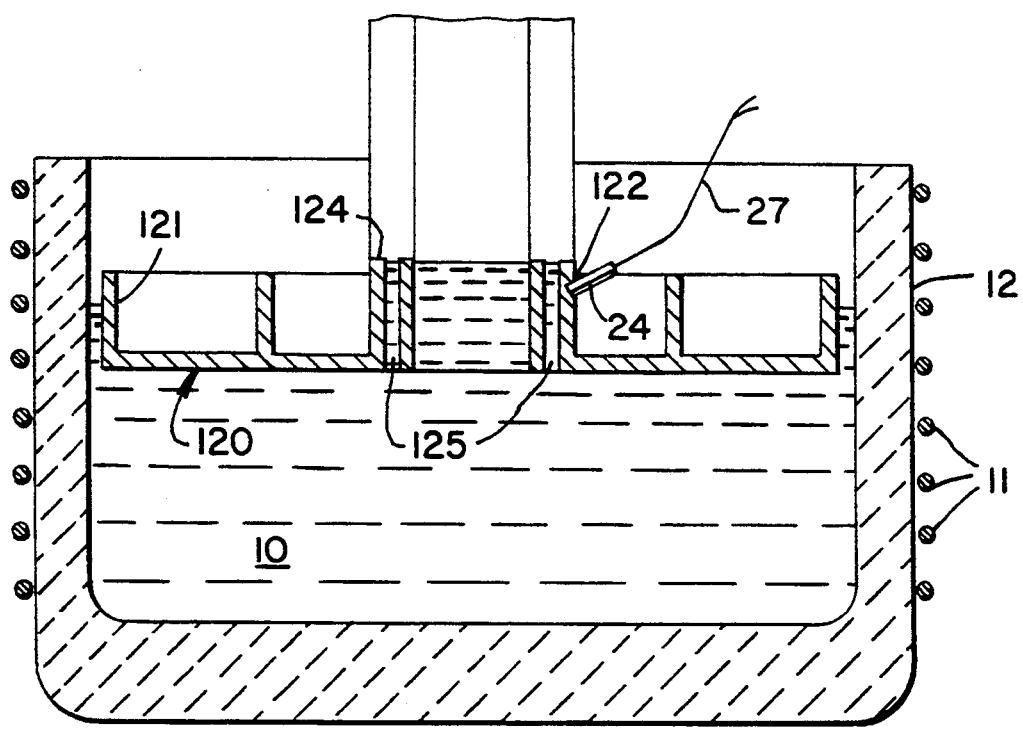
FIG. 21 is a schematic cross-sectional view of a float which may be used to form tubes.

Single crystal tubes can also be grown in accordance with the invention. An exemplary embodiment of a float 120 which will provide such tubes is shown in FIG. 21. The float 20 has an outer wall 121, providing a flotation structure enclosing a volume sufficient to allow the float 120 to float on the melt 10, a shaper structure 122 having a top surface 124 which is above the top level of the melt 10, and capillary channels 125 extending from the bottom of the float through the shaper structure to the top surface 124 to draw melt to the top surface by capillary action where it solidifies to form a hollow tube. The top surface 124 is wetted by the melt and the other surfaces of the float may also be wetted by the melt. The temperature of the shaper 122 is monitored by a thermocouple 24 and closely controlled so that the crystal is consistently formed just above the top surface 124.

Figure 22:
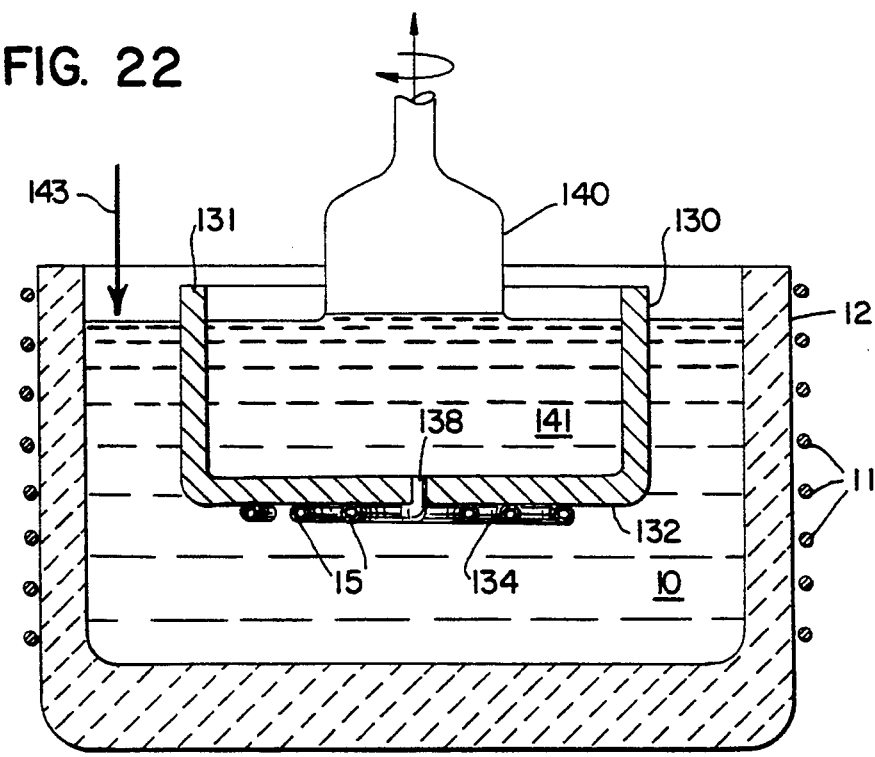
FIG. 22 is a schematic cross-sectional view of apparatus in accordance with the invention which provides dopant segregation without shaping and allows feeding of material for continuous crystal growth.
Figure 23:
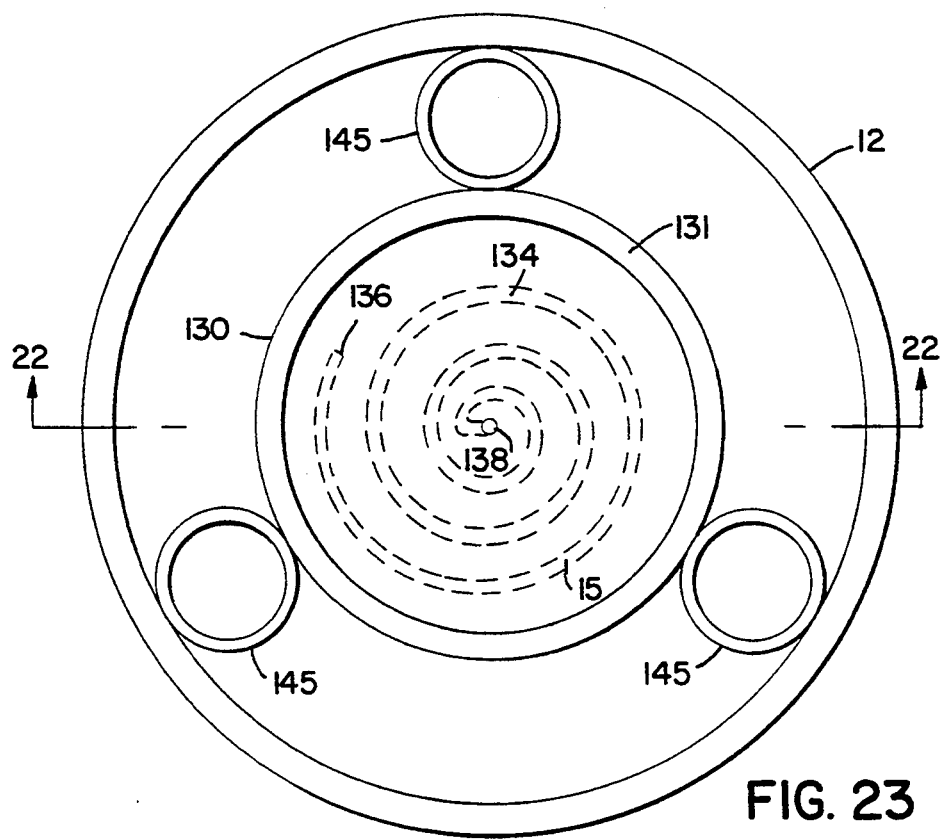
FIG. 23 is a top view of the apparatus of FIG. 22.

In the embodiment of FIGS. 22 and 23, a float 130 is formed in a bowl shape, having a circular sidewall 131 extending up from a flat bottom wall 132. A melt passageway 15 is formed in a tube 134 having a spiral pattern which extends from an entrance 136 to an opening 138 into the center of the float 130. The spiral passageway 15 may be formed in various other ways than as the separate tube 134, e.g., by making the bottom wall 132 in two parts, one of which has a spiral channel formed therein with the other formed as a flat plate which closes the top of the channel. In effect, the spiral tube 134 provides a long, continuous turn of the horizontal portion of the passageway 15, the total length of which is much longer than the width of the bottom wall of the float. A single crystal 140 is drawn from the melt 141 within the bowl shaped float 130. Sufficient space is provided between the sidewall 131 of the float and the inner side of the crucible 12 to allow raw material, e.g., powder or a polycrystalline rod, to be added to the melt 10, as represented by the arrow 143 shown in FIG. 22. The float 130 may be made of materials heavier than and wetted by the melt 10. For example, metals such as Pt, Mo, and It, and quartz, may be used as floats for melts of some halides and oxides, such as a HaNO3 melt doped with Pb(NO3)2 using glass as the float material. To support the float, cup-like buoys 145 may be attached to the outer side of the wall 131 of the float. The buoy cups 145 provide a flotation structure which encloses a volume sufficient to support the float. The cups 145 also hold the float in position away from the crucible wall while leaving room to introduce raw material to the melt. The long passageway 15 serves to control dopant segregation, while the apparatus otherwise allows the conventional Czochralski process to be performed. The embodiment of FIGS. 22 and 23 thus also allows materials heavier than the melt to be used as the float material to allow control of dopant segregation or crystal shape, or both.

Various crystalline materials can be grown using the present invention. Examples are Si, Ge, InSb, Al, Sn (e.g., using a graphite shaper), GaAs (using a BN shaper), superalloys ($Al_2O_3$) and many others. The following examples are illustrative of the application of the invention but it is understood that the invention is not so limited.

EXAMPLES

Example 1

Growth of Single $NaNO_3$ Crystals

A modified Czochralski method of crystal growth using the apparatus shown in FIG. 16 was used to produce $NaNO_3$ single crystals. Aluminum, which is chemically compatible with and wetted by the $NaNO_3$ melt, was chosen as the material of the shaper 50. The density of aluminum is about 2.7 g $cm^{-3}$ whereas that of the $NaNO_3$ melt is about 1.9 g $cm^{-3}$. A stainless steel crucible was used, the inside diameter being 10.2 cm, the depth 7.0 cm and the wall thickness 0.64 cm. The crucible was heated from its wall and its bottom was insulated. The initial depth of the melt in the crucible was about 2.5 cm (about 400 g). The outside of the float was 10.1 cm in diameter and about 1.5 cm high. The wall and the bottom of the float were about 0.16 cm thick. The shaper was a cylinder located at the center of the float, 2.5 cm in diameter, about 1.5 cm high from the inside bottom of the float and containing a 0.16 cm diameter hole along the axis. A thermocouple made of 0.013 diameter wires of chromel and alumel was secured in a tiny hole located about 0.3 cm below the top of the shaper and 0.1-0.2 cm from its wall. This thermocouple was connected to a temperature controller which regulated the power input to the crucible heater. The temperature controller was set at a temperature (called the shaper temperature) slightly above the melting point of $NaNO_3$, usually in the range of 308° to 312° C. This effectively prevented heterogeneous nucleation of new grains from occurring at the top of the shaper.

An $NaNO_3$ single crystal seed was lowered to touch the center of the shaper top and the seed tip was allowed to melt. After the float temperature stabilized to the predetermined value, crystal growth was started by pulling the seed upward at a constant speed of 0.5 cm $hr^{-1}$.

It was observed that the portion of the melt between the float wall and the crucible was not below but even with the top of the float wall. Apparently, the small gap between the two walls (0.05 cm) caused the melt to rise by the capillary effect and formed a melt film. Keeping the melt below the top of the float wall is readily accomplished. This precaution, however, was not even necessary since the melt film did not cause any problems. In fact, it acted as a perfect lubricant, allowing the float to descend very smoothly throughout crystal growth.

A round single crystal of NaNO3 2.5 cm in diameter was grown and the control over the crystal cross-section was found to be excellent. A 4.1 cm round crystal was also grown and the cross-section was again very uniform. Rectangular single crystals, 3.2 cm by 1.9 cm in cross-section and 30 cm long, were also grown. The control over the cross-sectional shape and size was excellent.

In order to observe the shape of the growth front, the crystals were suddenly pulled up and separated from the shaper. The growth fronts were very flat.

The shaper wall temperature appeared to be the most critical parameter affecting the cross-section control. In general, float temperatures from 308° to 312° C. were found most desirable. With too high a float temperature, the crystal failed to grow to the full cross-section. In fact, it even failed to grow straight if it was much smaller in cross-section than the shaper wall. With too low a shaper wall temperature, on the other hand, the melt solidified inside and choked off the hole in the float. When this occurred, feeding stopped immediately and the crystal became separated from the float.

When growing long crystals, a thin film of melt was sometimes observed at the root of the shaper wall. This melt film, slightly yellow in color, is believed to some sort of impurities which somehow crept very slowly down the surface of the shaper wall. Since a significant amount of moisture was absorbed by the as-received NaNO3 powder, gas porosity was often present in the crystals. It was observed that the higher the shaper wall temperature, the fewer the gas bubbles in the crystal.

Example 2

Growth in Single Crystal of Sn

A modified Czochralski method of crystal growth using the apparatus shown in FIG. 1 was used to produce single Sn crystals. The float was made of graphite. A bulk melt was formed of Sn doped with Pb. A stainless steel crucible of 10.16 cm inside diameter and 6.99 cm depth was used. The crucible was resistance heated from the wall. The melt was Sn-0.050% Pb (wt %) and initially 1556 g. The equilibrium segregation ratio k is about 0.13 for Sn melts with a low concentration of Pb. The design of the graphite float is illustrated in FIG. 1. As shown, it consisted of two pieces. The upper piece 14 was a disk with an outside diameter of 9.76 cm, an aperture of 2.54 cm diameter and a thickness of 0.64 cm. The lower piece 17 was essentially a flat round boat, with an outside diameter of 10.08 cm, a flat bottom 0.64 cm thick, and a vertical wall 0.16 cm thick and 0.87 cm high. The top surface of the lower piece was machined to have a long groove 15 with a small rectangular cross-section 0.40 cm wide and 0.32 cm deep. This groove originated from a 0.40 cm diameter hole 16 in the lower piece. It formed almost a complete circle of 8.80 cm diameter, and then went radially inward till it reached the aperture 18 of the upper piece 14. When assembled, the two pieces formed a long, narrow melt passageway in the float, about 28 cm in length and 0.40 cm by 0.32 cm in cross-section. During crystal growth the bulk melt in the crucible reached the growth zone through the passageway.

A thermocouple 24 was used to control the temperature of the float near the aperture. It was made of chromel and alumel wires 0.013 cm in diameter. Its tip was secured in a tiny hole located about 0.3 cm away from the aperture 18. The thermocouple was connected to a temperature controller 28 which regulated the power input to the crucible heater 11. The temperature controller was set at a temperature a few degrees above the freezing point of the melt during pulling to prevent heterogeneous nucleation of new grains from occurring at the aperture. During crystal growth the growth front was about 0.1 cm above the top surface of the float.

To keep the melt in the growth zone at a dopant concentration significantly above that of the bulk melt, a Sn-0.66% Pb ingot 2.38 cm in diameter and 0.48 cm high was loaded in the aperture before crystal growth. Since graphite ($\rho = 2.2$ g cm$^{-3}$) is lighter than Sn ($\rho = 7.3$ g cm$^{-3}$), a weight 22 was put on the top of the float to help the bulk melt go through the passageway and reach the growth zone. The weight 22 was a 620 g stainless steel ring.

A single crystal seed 0.6 cm in diameter was lowered to touch the melt in the growth zone. To help melt the tip of the seed, the float was kept at a temperature of about 242° C. About 0.3 cm of the seed was melted. To help the seed grow the temperature of the float was then gradually lowered to 238° C. and held constant at this level through crystal growth. The crystal pulling speed was 0.35 cm hr$^{-1}$. This pulling speed was sufficiently low to avoid constitutional supercooling, which was confirmed by the absence of cellular (or dendritic) structure in the resultant crystals.

Dopant segregation in the resultant crystals was measured by inductively coupled plasma (ICP) emission spectrometer analysis, with a 0.1 ppm accuracy. Shown in FIG. 17, the normalized dopant concentration of the crystal was found to be very close to that of the initial bulk melt, indicating excellent control over dopant segregation. This result is explained below.

The equilibrium segregation ratio k is defined as $k = C_S/C_L$, where $C_S$ and $C_L$ are the dopant concentrations of the crystal and the melt at the growth front, respectively. Therefore, from the zone-leveling point of view, the crystal can grow at a constant dopant concentration of $C_O$ if the melt in the growth zone can be kept at a constant concentration of $C_O/k$. To do so, dopant diffusion between the growth-zone ($C_O/k$) and the bulk melt ($C_O$) should be prevented. A long passageway prevents dopant diffusion from the growth zone toward the bulk melt, and hence the dopant concentration of the melt in the growth zone from dropping. Based on $k = 0.13$ and $C_O = 0.050\%$, $C_O/k = 0.385\%$. From the composition and volume of the small ingot preloaded in the aperture and the height of the growth front, it can be shown that the dopant concentration of the melt in the growth zone was about 0.397%. Since this was only slightly higher than 0.385%, the dopant concentration of the resultant crystal was initially slightly above and then gradually became constant at 0.050%.

Figure 17:
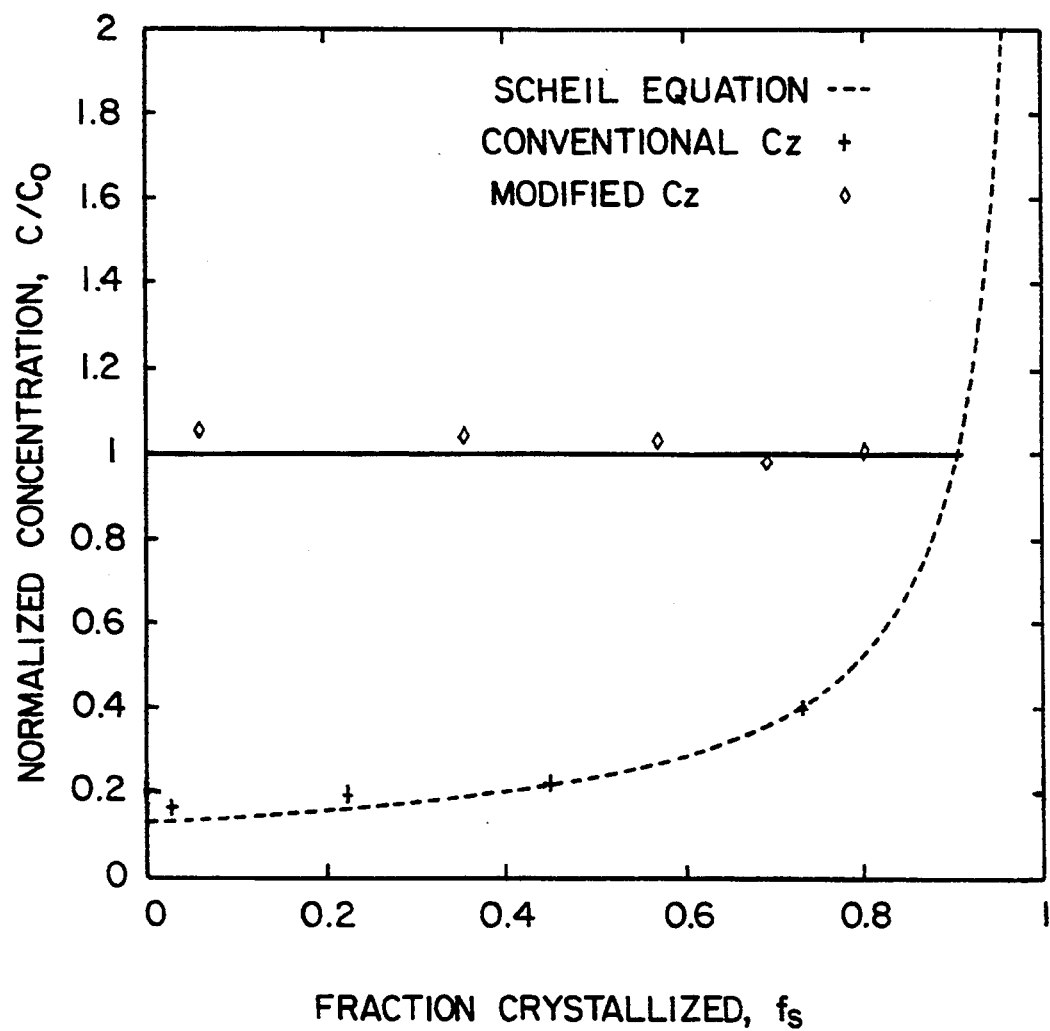
FIG. 17 is a graphical representation of axial segregation of Pb (dopant) in Sn single crystals grown by the conventional Czochralski method and by using the device shown in FIG. 1.

For comparison, a single crystal was pulled by the conventional Czochralski technique. As shown in FIG. 17, the resultant dopant segregation is found to be rather significant. The dopant segregation calculated from the so-called Scheil equation for normal freezing is also shown in FIG. 17.

As compared to the floating-crucible technique, the present invention has the following advantages. First, the float is very compact and yet a long melt passageway can be provided, effectively preventing dopant diffusion into the bulk melt. Second, the float is mechanically stable since it is flat rather than bowl-shaped. Third, a weight can be easily put on the mechanically stable float, eliminating the need for a weight-connecting shaft which goes through the main crucible and the melt in it. Fourth, shaped crystals can be grown.

If segregation control alone is needed, a larger growth zone can be used, as illustrated by the apparatus of FIG. 18. For semiconductor crystals, high-purity graphite crucibles are routinely used. Pyrolytic BN can be coated on the graphite float if it is required. A similar quartz float can also be designed, as illustrated in FIG. 19. A very long passageway, if required, can be obtained by simply making it spiral in shape.

The weight can be made of Mo or W rather than stainless steel if high temperatures are expected. The weight and the float can be screwed or fastened together with graphite, Mo or W screws.

Example 3

Effect Of Temperature Control

Experiments were performed using a non-wetted shaper as shown in FIG. 1. Graphite was selected as the shaper material since it is not wetted by melts of many semiconductors and metals. To allow close observation of crystal growth, a low melting-point material, $Sn(T_m=232°$ C.), was chosen as the melt. A stainless steel crucible was used, the inner diameter being 10.2 cm, the depth 7.0 cm and the wall thickness 0.64 cm. The crucible was heated from its wall, its bottom being insulated. The shaper 70 was a disk-like cover floating on the melt surface. It was 0.32 cm thick, 10.0 cm in diameter and with a rectangular aperture 23 of 3.2 cm by 1.9 cm (1.25 in by 0.75 in). Since graphite is significantly lighter than the Sn melt, a weight of about 160 g was secured on top of the shaper to help bring the melt through the aperture. The initial height of the melt in the crucible was about 2.5 cm.

A thermocouple 24 made of 0.013 cm diameter wires of chromel and alumel was secured in a tiny hole located about 0.3 cm off the midpoint of the long side of the aperture defined by the shaper wall. Since the shaper thermocouple was a short distance away from the aperture, its temperature was expected to be slightly lower than the actual aperture temperature. An experiment was conducted to determine this temperature difference. In brief, the shaper wall temperature was allowed to decrease slowly during crystal pulling while the growing crystal was watched closely. It was observed that when the growing crystal stuck to the shaper wall and started to lift it up, the thermocouple indicated a temperature of 230° C., which is 2° C. below the freezing temperature of Sn. In other words, the actual aperture temperature was about 2° C. higher than the thermocouple temperature. A 0.6 cm diameter and about 4 cm long seed was used to initiate crystal growth. It was observed that a float thermocouple temperature of about 243° C., the top of the seed melted readily and this seed melting temperature was thus adopted.

Single crystals were grown in three different ways: (1) with shaper temperature control, (2) with no temperature control and (3) with crucible temperature control.

With shaper temperature control, the thermocouple was connected to a temperature controller which regulated the power input to the crucible heater. In this way, the temperature of the shaper wall near the aperture could be controlled during crystal growth. After the seed tip melted, pulling commenced at the speed of 4 cm/hr. Meanwhile, the setting of the temperature controller was reduced to 233° C. to help the crystal grow larger in cross-section. The pulling speed was increased to about 7 cm/hr when the full crystal cross-section was essentially reached.

With no temperature control, the thermocouple was disconnected from the temperature controller. In other words, the shaper wall temperature was only monitored but not controlled. After the seed tip melted, the heater power was manually reduced to allow the shaper thermocouple temperature to stabilize at about 233° C. Pulling then commenced at the speed of about 7 cm/hr.

With crucible temperature control, a thermocouple at the center of the crucible bottom was connected to a temperature controller which regulated the power input to the crucible heater. In other words, the crucible temperature was controlled, rather than the shaper temperature. The shaper wall temperature, however, was still monitored through the thermocouple. After the seed tip melted, pulling commenced at about 4 cm/hr. Meanwhile, the setting of the temperature controller was reduced to a level corresponding to a shaper thermocouple temperature of about 233° C. The pulling speed was then increased to about 7 cm/hr when the full crystal cross-section was essentially reached.

Figure 20:
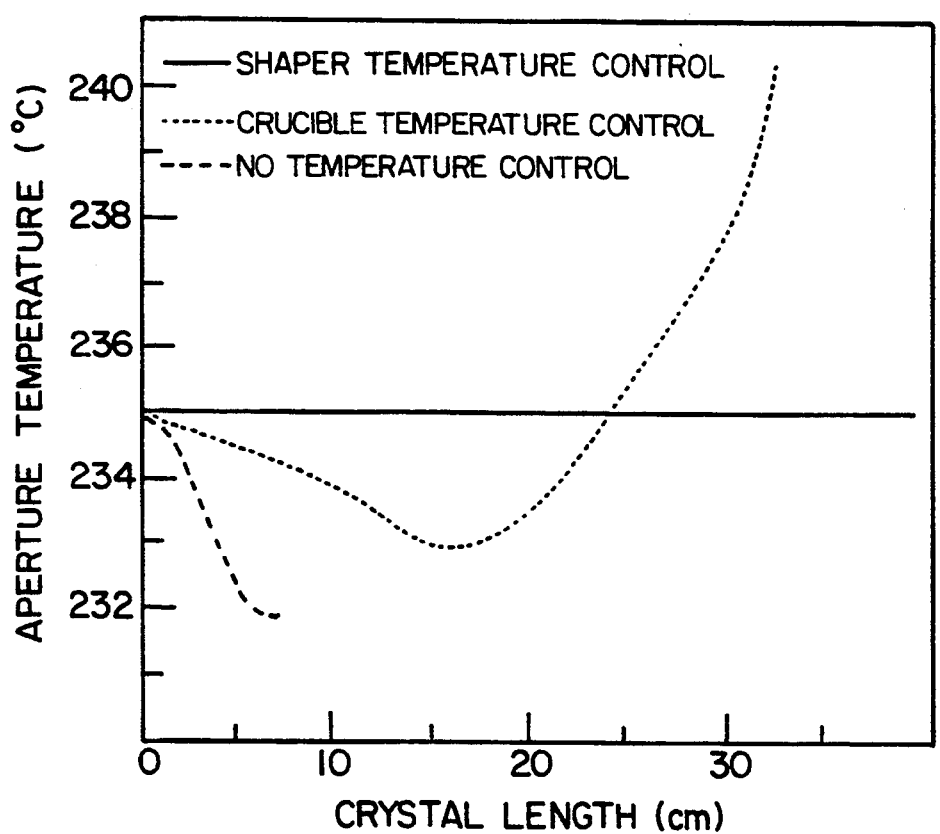
FIG. 20 is a graph showing float temperature under various temperature control conditions.

FIG. 20 shows the temperature of the shaper wall aperture as a function of the length of the growing crystal for each of the three cases of crystal growth. As already mentioned, the aperture temperature was about 2° C. higher than the thermocouple temperature.

Where the shaper wall temperature was controlled, its temperature remained constant at 235° C. during crystal growth. A 2.5 cm diameter crystal and a 3.2 cm by 1.9 cm rectangular crystal were grown. Control over the cross-sectional shape and size was excellent. To reveal the shapes of the crystal/melt interfaces, the crystals were suddenly raised from the melt during crystal growth and were found to be very flat. Similar crystals were also grown significantly longer, e.g., about 50 cm in length.

Where no temperature control was utilized, the aperture temperature dropped from 235° C. at the beginning of pulling to the freezing point of the melt (232° C.), as shown in FIG. 20. The crystal stuck to the shaper after growing about 6 cm. A somewhat longer crystal, grown with a higher initial aperture temperature of about 239° C. also stuck to the shaper wall.

Where the crucible temperature was controlled, the aperture temperature varied significantly during crystal growth, as shown in FIG. 20. The aperture temperature, initially at 235° C., decreased as crystal growth proceeded. It dropped to a minimum of 233° C. at the crystal length of about 16 cm, and then rose to about 240° C. at the end of pulling. The resultant crystal was 33 cm long. In the last 8 cm of the crystal, where the aperture temperature exceeded 236° C., the crystal became smaller in cross-section.

Constant shaper wall temperature during crystal growth was thus found to allow the excellent control over the crystal cross-section in accordance with the present invention. Since the shaper wall temperature was always above the freezing point of the melt, the crystal did not stick to the shaper. Also, since the temperature was always only a few degrees above the freezing point, the meniscus was short and stable and the crystal cross-section was well defined by the aperture opening. The meniscus here refers to the free surface of the melt above the shaper wall.

Although a thermocouple was used for shaper wall temperature control, other means of shaper temperature control can also be used, e.g., an optical pyrometer.

With no temperature control, although the aperture temperature was allowed to stabilize (to 235° C.), it dropped quickly after crystal pulling started. This occurred because as the length, and hence the surface area of the crystal increased, the heat losses from the crystal surface also increased. In other words, the growing crystal acted increasingly as a heat sink and caused the aperture temperature to drop. When the aperture temperature dropped to the freezing point of the melt, the crystal stuck to the shaper.

As in the case of no temperature control, where the crucible temperature was controlled, the aperture temperature dropped after crystal pulling commenced. However, the rate of temperature drop was significantly slower than that in the case of no temperature control because the power input to the crucible heater was raised automatically to maintain a constant temperature at the crucible bottom. The heat losses from the crystal surface, and hence the heat sink effect of the growing crystal, continued to increase as the crystal grew longer. However, they gradually leveled off as the crystal grew significantly longer than the crucible, e.g., twice as long. Meanwhile, the height of the melt in the crucible continued to drop, thus bringing the float closer to the crucible bottom (where the temperature was fixed) and increasing the height of the (hot) crucible inner wall surrounding the crystal. Both of these changes resulted in an increased heat transfer to the float and the crystal, thus causing the aperture temperature to rise.

It is understood that the invention is not confined to the particular embodiments disclosed herein, but embraces all such forms as come within the scope of the following claims.

What is claimed is:

1. Apparatus for growing a monocrystalline body from a bulk melt comprising:
   (a) a crucible having lateral walls for containing the bulk melt of molten material:
   (b) heater means for heating the bulk melt within the crucible:
   (c) a float which is positioned on the surface of the bulk melt, the float capable of floating on the bulk melt, the float having a plurality of shaper walls which define plural separate crystal growth zones, each crystal growth zone defined by a shaper wall connected by a passageway to the bulk melt to permit simultaneous production of plural monocrystalline bodies, each shaper wall therein including a shaper edge that defines the boundary of a crystal growth zone and of the cross-section of the monocrystalline body that is formed as the molten material solidifies, and wherein the passageways in the float from the bulk melt to each growth zone are sufficiently long to prevent diffusion of dopants from the crystal growth zone toward the bulk melt.

2. Apparatus for growing a monocrystalline body from a bulk melt comprising:
   (a) a crucible having lateral walls for containing the bulk melt of molten material:
   (b) heater means for heating the bulk melt within the crucible;
   (c) a float which is positioned on the surface of the bulk melt, the float capable of floating on the bulk melt, the float having a shaper wall therein including a shaper edge that defines the boundary of a crystal growth zone and of the cross-section of the monocrystalline body that is formed as the molten material solidifies, and a passageway in the float from the bulk melt to the growth zone which is sufficiently long to prevent diffusion of dopants from the crystal growth zone toward the bulk melt wherein the float has a flat bottom portion which meets the top surface of the bulk melt, and the passageway is formed as a channel in the bottom portion of the float which extends horizontally from an opening through a long path to the crystal growth zone.

3. Apparatus for growing a monocrystalline body from a bulk melt comprising:
   (a) a crucible having lateral walls for containing the bulk melt of molten material;
   (b) heater means for heating the bulk melt within the crucible:
   (c) a float which is positioned on the surface of the bulk melt, the float capable of floating on the bulk melt, the float having a shaper wall therein including a shaper edge that defines the boundary of a crystal growth zone and of the cross-section of the monocrystalline body that is formed as the molten material solidifies, and a passageway in the float from the bulk melt to the growth zone which is sufficiently long to prevent diffusion of dopants from the crystal growth zone toward the bulk melt wherein the shaper wall is an outwardly facing wall and the float has a top surface which intersects the shaper wall at the shaper edge, the passageway opening onto the top surface, at least the top surface being wettable by the melt.

4. The apparatus of claim 3 wherein the float has an upwardly extending peripheral rim which encloses the remainder of the float and prevents bulk melt from flowing over the float thereby to help support the float.

5. The apparatus of claim 3 wherein the top surface of the float is separated by a stem above the rest of the float, wherein the float includes a peripheral float collar enclosing a volume which helps float the shaper and also surrounding a volume which is in communication with the bulk melt through the passageway, and wherein the top surface has openings therein to allow melt to pass from the volume of melt held within the collar onto the top surface of the shaper.

6. Apparatus for growing a monocrystalline body from a bulk melt, comprising:
   (a) a crucible having lateral walls for containing the bulk melt of molten material;
   (b) heater means for heating the bulk melt within the crucible;
   (c) a float which is positioned on the surface of the bulk melt, the float capable of floating on the bulk melt, the float having a shaper wall therein including a shaper edge that defines the boundary of a crystal growth zone and of the cross-section of the monocrystalline body that is formed as the molten material solidifies, and a passageway in the float to allow flow of melt from the bulk melt to the crystal growth zone; and
   (d) means for monitoring the temperature of the float adjacent the shaper wall and controlling the heat applied to the bulk melt by the heater means so that the float can be maintained at a temperature near and above the solidifying temperature of the melt to maintain control over the cross-section of the growing crystal.

7. The apparatus of claim 6 wherein the float is wetted by the melt.

8. The apparatus of claim 6 wherein the passageway is sufficiently long and narrow that the flow through the passageway prevents dopant diffusion from the growth zone to the bulk melt.

9. The apparatus of claim 6 wherein the means for monitoring temperature includes a thermocouple mounted to the float adjacent the shaper wall, and wherein the heater means comprises an electrical heater coil around the crucible and the means monitors the temperature with the thermocouple and supplys electrical power to the heater coil when the monitored temperature of the float drops below a desired temperature.

10. Apparatus for growing a monocrystalline body from a bulk melt, comprising:
    (a) a crucible having lateral walls for containing the bulk melt of molten material;
    (b) heater means for heating the bulk melt within the crucible;
    (c) a float which is positioned on the surface of the bulk melt, the float capable of floating on the bulk melt, the float having a shaper wall therein including a shaper edge that defines the boundary of a crystal growth zone and of the cross-section of the monocrystalline body that is formed as the molten material solidifies, and a passageway in the float to allow flow of melt from the bulk melt to the crystal growth zone; and
    (d) means for monitoring the temperature of the float adjacent the shaper wall and controlling the heat applied to the bulk melt by the heater means so that the float can be maintained at a temperature near and above the solidifying temperature of the melt to maintain control over the cross-section of the growing crystal wherein there are a plurality of shaper walls which define plural separate crystal growth zones, and wherein the means for monitoring temperature monitors the temperature at positions adjacent to each shaper wall.

11. Apparatus for growing a monocrystalline body from a bulk melt comprising:
    (a) a crucible having lateral walls for containing the bulk melt of molten material;
    (b) heater means for heating the bulk melt within the crucible;
    (c) a float positioned on the surface of the bulk melt, the float capable of floating on the bulk melt, the float having a wall therein that defines the boundary of a crystal growth zone, and means for flowing melt through a passageway in the float from the bulk melt to the growth zone while preventing diffusion of dopants from the crystal growth zone toward the bulk melt; and
    (d) means for monitoring the temperature of the float adjacent the wall of the float and controlling the heat applied to the bulk melt by the heater means so that the float can be maintained at a temperature sufficiently near and above the solidifying temperature of the melt.

12. The apparatus of claim 11 wherein the float is wetted by the melt.

13. The apparatus of claim 11 wherein the float is not wetted by the bulk melt and is less dense than the bulk melt, and including weights on the float to press the float into the melt to help force melt through the passageway to the growth zone.

14. The apparatus of claim 11 wherein the float has a flat bottom portion which meets the top surface of the bulk melt, and the passageway is formed as a channel in the bottom portion of the float which extends horizontally from an opening through a long path to the crystal growth zone.

15. Apparatus for growing a monocrystalline body from a bulk melt comprising:
    (a) a crucible having lateral walls for containing the bulk melt of molten material;
    (b) heater means for heating the bulk melt within the crucible; and
    (c) a float positioned on the surface of the bulk melt, the float capable of floating on the bulk melt, the float having a wall therein that defines the boundary of a crystal growth zone and a bottom wall separating the crystal growth zone from the bulk melt, and means for flowing melt through a passageway from the bulk melt to the growth zone having a portion which extends horizontally while preventing diffusion of dopants from the crystal growth zone toward the bulk melt.

16. The apparatus of claim 15 wherein the float is wetted by the melt and the material of the float is denser than the melt, and including buoy portions to support the float on the bulk melt.

17. The apparatus of claim 15 wherein the float is not wetted by the bulk melt and is less dense than the bulk melt, and including weights on the float to press the float into the melt to help force melt through the passageway to the growth zone.

18. The apparatus of claim 15 wherein the passageway extends horizontally through a path which includes at least one turn.

19. The apparatus of claim 15 wherein the passageway is formed as a spiral channel.

20. The apparatus of claim 15 wherein the passageway is longer than the horizontal width of the bottom wall of the float.

21. Apparatus for growing a monocrystalline body from a bulk melt, comprising:
    (a) a crucible having lateral walls for containing the bulk melt of molten material;
    (b) heater means for heating the bulk melt within the crucible; and
    (c) a float of material wetted by the melt which is positioned on the surface of the bulk melt, the float having flotation structure enclosing a volume to support the float on the bulk melt, the float having a shaper wall therein that defines the boundary of a crystal growth zone and of the cross-section of the monocrystalline body that is formed as the molten material solidifies, and a passageway in the float to allow flow of melt from the bulk melt to the crystal growth zone.

22. The apparatus of claim 21 wherein the passageway is sufficiently long and narrow that the flow through the passageway prevents dopant diffusion from the growth zone to the bulk melt.

23. The apparatus of claim 21 including means for monitoring the temperature of the float adjacent the shaper wall and controlling the heat applied to the bulk melt by the heater means so that the float can be maintained at a temperature sufficiently near and above the solidifying temperature of the melt to maintain control over the cross-section of the growing crystal.

24. The apparatus of claim 21 wherein there are a plurality of shaper walls which define plural separate crystal growth zones, each crystal growth zone defined by a shaper wall connected by a passageway to the bulk melt to permit simultaneous production of plural monocrystalline bodies.

25. The apparatus of claim 21 wherein the shaper wall is an outwardly facing wall and the float has a top surface which intersects the shaper wall at the shaper edge, the passageway opening onto the top surface, the top surface being wettable by the melt.

26. The apparatus of claim 25 wherein the flotation structure comprises an upwardly extending peripheral rim which encloses the remainder of the float and prevents bulk melt from flowing over the float thereby to help support the float.

27. The apparatus of claim 21 wherein the top surface of the float is separated by a stem above the rest of the float, wherein the flotation structure includes a peripheral float collar enclosing a volume which helps float the shaper and also surrounding a volume which is in communication with the bulk melt through the passageway, and wherein the top surface has openings therein to allow melt to pass from the volume of melt held within the collar onto the top surface of the shaper.

* * * * *